United States Patent
Kim et al.

(10) Patent No.: US 8,546,153 B2
(45) Date of Patent: Oct. 1, 2013

(54) RESIN DISPENSING APPARATUS FOR LIGHT EMITTING DEVICE PACKAGE AND METHOD OF MANUFACTURING LIGHT EMITTING DEVICE PACKAGE USING THE SAME

(75) Inventors: Joo Yong Kim, Gyunggi-do (KR); Seung Ki Choi, Gyunggi-do (KR); Jee Hun Hong, Gyunggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 64 days.

(21) Appl. No.: 13/295,411

(22) Filed: Nov. 14, 2011

(65) Prior Publication Data
US 2012/0129281 A1    May 24, 2012

(30) Foreign Application Priority Data
Nov. 22, 2010    (KR) .................. 10-2010-0116371

(51) Int. Cl.
H01L 21/00    (2006.01)
(52) U.S. Cl.
USPC ............. 438/10; 438/15; 438/17; 438/25; 438/26; 438/51; 438/55; 438/124
(58) Field of Classification Search
None
See application file for complete search history.

(56) References Cited

U.S. PATENT DOCUMENTS

| | | | | |
|---|---|---|---|---|
| 5,720,324 A * | 2/1998 | Vinciarelli | ................. | 141/1 |
| 5,722,467 A * | 3/1998 | Vinciarelli | ................. | 141/34 |
| 6,814,110 B2 * | 11/2004 | Gardos | ................. | 141/198 |
| 2004/0112914 A1 * | 6/2004 | Gardos | ................. | 222/1 |

FOREIGN PATENT DOCUMENTS

| | | |
|---|---|---|
| JP | 07-066539 | 3/1995 |
| KR | 10-2008-0020886 A | 3/2008 |

* cited by examiner

*Primary Examiner* — David E Graybill
(74) *Attorney, Agent, or Firm* — McDermott Will & Emery LLP

(57) ABSTRACT

There is provided a resin dispensing apparatus for a light emitting device package and a method of manufacturing a light emitting device package using the same. The resin dispensing apparatus includes a resin dispensing part including a resin storage portion filled with a resin therein and a resin discharge portion combined with the resin storage portion and discharging the resin therefrom; a supporting part having a light emitting device package disposed on an upper surface thereof and electrically connected to the light emitting device package; a voltage applying part having both terminals respectively connected to the resin dispensing part and the supporting part to apply a voltage thereto; and a sensing part electrically connected to the resin dispensing part and the supporting part individually and sensing a contact between the resin dispensing part and the light emitting device package with an electrical signal.

8 Claims, 4 Drawing Sheets

RESIN DISPENSING APPARATUS FOR LIGHT EMITTING DEVICE PACKAGE AND METHOD OF MANUFACTURING LIGHT EMITTING DEVICE PACKAGE USING THE SAME

CROSS-REFERENCE TO RELATED APPLICATIONS

This application claims the priority of Korean Patent Application No. 10-2010-0116371 filed on Nov. 22, 2010, in the Korean Intellectual Property Office, the disclosure of which is incorporated herein by reference.

BACKGROUND OF THE INVENTION

1. Field of the Invention

The present invention relates to a resin dispensing apparatus for filling a light emitting device package with a resin and a method of manufacturing a light emitting device package using the same.

2. Description of the Related Art

Recently, as the brightness of a light emitting device such as a light emitting diode (LED) has increased, such a light emitting device has been used as a light source for a display device, a lighting apparatus, a car or the like. A light emitting device is able to emit white light by using phosphors or by combining light of various colors. In order to use an LED for such a purpose, the device should be low in operational voltage and high in light emission efficiency and brightness.

In a general light emitting diode structure, a package is manufactured in a manner such that an LED is die-bonded to a lead frame structure formed of a conductive metal using an adhesive resin and an upper portion of the LED is molded using a filling material formed of a composite resin such as silicone resin, epoxy resin and the like. Here, a molding resin containing a variety of filling materials including a phosphor powder is put onto the lead frame package attached to the LED. The molding resin protects an LED chip and a wire and increases light emitting efficiency at a boundary with the outside by adjusting refraction index matching.

During the filling of the package with the molding resin, a mixture of silicone resin and a phosphor is discharged using a dispensing needle. At this time, the dispensing needle may be inserted into the resin of the package and cause damage to the wire and the chip, resulting in defects due to wire short circuiting or other damage. In this case, it is difficult to identify a defective wire package. As a result, reliability in the manufacturing process of the package may be degraded.

SUMMARY OF THE INVENTION

An aspect of the present invention provides a resin dispensing apparatus improving reliability in the manufacturing process of a light emitting device package and a method of manufacturing a light emitting device package using the same.

According to an aspect of the present invention, there is provided a resin dispensing apparatus for a light emitting device package, the resin dispensing apparatus including: a resin dispensing part including a resin storage portion filled with a resin therein and a resin discharge portion combined with the resin storage portion and discharging the resin therefrom; a supporting part having an area on an upper surface thereof in which a light emitting device package is disposed when the resin is dispensed to the light emitting device package, and electrically connected to the light emitting device package; and a sensing part electrically connected to the resin dispensing part and the supporting part individually and sensing a contact between the resin dispensing part and the light emitting device package with an electrical signal.

The supporting part may be electrically connected to the light emitting device package by being in contact with lead frames of the light emitting device package.

The supporting part may include a circuit pattern or a via hole for making electrical connections with the light emitting device package.

The resin dispensing apparatus may further include a voltage applying part having both terminals respectively connected to the resin dispensing part and the supporting part to apply a voltage thereto.

The resin dispensing apparatus may further include a notifying part operating when the electrical signal sensed by the sensing part is greater than a preset value.

The notifying part may be an indicator converting the sensed electrical signal into a visual signal.

The notifying part may be an alarm converting the sensed electrical signal into an audible signal.

According to another aspect of the present invention, there is provided a resin dispensing apparatus for a light emitting device package, the resin dispensing apparatus including: a resin storage portion filled with a resin therein; a resin discharge portion combined with the resin storage portion and discharging the resin therefrom; and a contact portion disposed outwardly of the resin discharge portion, having an end thereof corresponding to an end of the resin discharge portion, and formed to be in contact with at least a portion of a package body when the resin is dispensed to the package body.

The contact portion may have a diameter larger than a width of the light emitting device package and smaller than a length of the light emitting device package.

The contact portion may surround the resin discharge portion.

The contact portion and the resin discharge portion may have the same height.

The contact portion may be spaced apart from the resin discharge portion by a predetermined distance therebetween.

The resin discharge portion and the contact portion may have a cylindrical shape having the same axis and different diameters.

According to another aspect of the present invention, there is provided a method of manufacturing a light emitting device package, the method including: disposing a light emitting device on a supporting part electrically connected to the light emitting device; and dispensing a resin to the light emitting device using a resin dispensing part electrically connected to the supporting part and discharging the resin therefrom, wherein the dispensing of the resin includes sensing whether or not the resin dispensing part is in contact with a light emitting device package with an electrical signal.

The resin dispensing part may include a resin storage portion filled with the resin and a resin discharge portion combined with the resin storage portion and discharging the resin therefrom, and the electrical signal may be sensed through a contact between the resin discharge portion and the light emitting device.

The electrical signal may be sensed through a contact between a wire connected to the light emitting device and the resin dispensing part.

According to another aspect of the present invention, there is provided a method of manufacturing a light emitting device package, the method including: disposing a light emitting device; and dispensing a resin to the light emitting device using a resin dispensing apparatus, wherein the dispensing of the resin includes leaving a scratch on a light emitting device package when a lower portion of the resin dispensing apparatus is in contact with the light emitting device package.

The resin dispensing apparatus may include a resin discharge portion discharging the resin therefrom, and a contact portion disposed outwardly of the resin discharge portion and having an end thereof corresponding to an end of the resin discharge portion, and the light emitting device package may be scratched by a contact between the contact portion and the light emitting device package.

The light emitting device package may include a package body filled with the resin and having a rectangular shape, and the contact portion may have a diameter larger than a width of the package body and smaller than a length of the package body such that the contact portion leaves the scratch on the light emitting device package when being in contact with the package body.

The contact portion and the resin discharge portion may have the same height, and the contact portion may leave the scratch on the light emitting device package when the resin discharge portion is injected into the light emitting device package in the dispensing of the resin.

The method may further include identifying whether the light emitting device package is defective or not depending on the scratch left on the light emitting device package.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
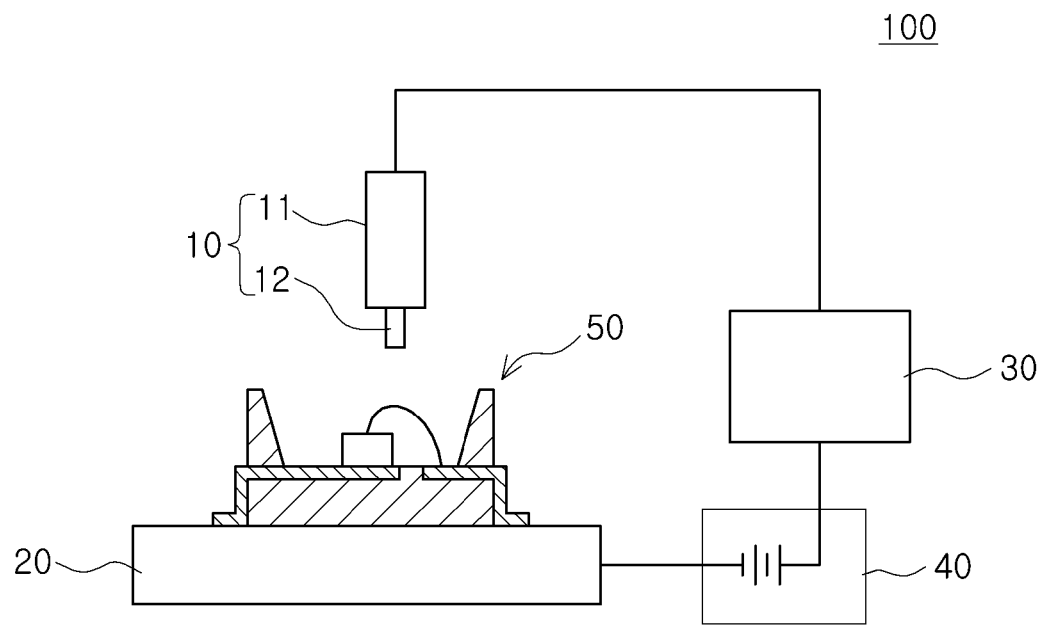
FIG. 1 is a schematic view illustrating a resin dispensing apparatus for a light emitting device package according to an exemplary embodiment of the present invention.

Exemplary embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like elements.

FIG. 1 is a schematic view illustrating a resin dispensing apparatus for a light emitting device package according to an exemplary embodiment of the present invention. With reference to FIG. 1, a resin dispensing apparatus 100 according to an exemplary embodiment of the invention includes a resin dispensing part 10 including a resin storage portion 11 filled with a liquid resin and a resin discharge portion 12 combined with a lower portion of the resin storage portion 11 and discharging the resin therefrom; a supporting part 20 having a light emitting device package 50 disposed on an upper surface thereof at the time of the dispensing of the resin and electrically connected to the light emitting device package 50; a voltage applying part 40 having both terminals respectively connected to the resin dispensing part 10 and the supporting part 20 to apply a voltage thereto; and a sensing part 30 electrically connected to the resin dispensing part 10 and the supporting part 20 and sensing a contact between the resin discharge portion 12 and the light emitting device package 50 with an electrical signal.

The resin dispensing part 10 may include the resin storage portion 11 filled with a liquid resin and the resin discharge portion 12 combined with the lower portion of the resin storage portion 11 and discharging the liquid resin therefrom. The resin storage portion 11 has a space therein such that the space is filled with the liquid resin to be dispensed to an interior portion of a package body. In FIG. 1, the resin storage portion 11 has a cylindrical shape; however, it will be obvious to a person having ordinary skill in the art to which the present invention pertains that the shape thereof is not limited, so long as the resin storage portion 11 has a space for storing the liquid resin therein. Although not shown, the resin dispensing part 10 may further include a resin supply path and a body that are connected to the resin storage portion 11 and supplying an appropriate amount of resin thereto.

The resin storage portion 11 may be filled with the liquid resin for manufacturing the light emitting device package 50. Here, the liquid resin may allow light emitted from a light emitting device to be transmitted therethrough, and may allow a phosphor, a reflective material or the like that can be included within the liquid resin to be stably dispersed therein. Without being limited, any one of acrylic resin such as polymethyl methacrylate (PMMA) resin, polystyrene resin, polyurethane resin, benzoguanamine resin, epoxy resin and silicone resin may be used therefor. The liquid resin is applied to seal the light emitting device mounted in the package body and a conducting wire, thereby protecting the light emitting device and the conducting wire and serving as a lens which determines light distribution according to the shape thereof.

The resin discharge portion 12 may be provided on a lower end of the resin storage portion 11 in order to discharge the liquid resin to the outside of the resin storage portion 11. The resin discharge portion 12 constituting the resin dispensing part 10 may have the form of a needle or a nozzle. In general, a resin is dispensed within a distance of approximately 100 μm from the light emitting device package 50. Since diameters of the package body and the resin discharge portion 12 are within a range of hundreds of μm, the resin discharge portion 12 needs to be positioned within a predetermined distance from the package body in order to allow the resin to be stably received in the package body. For this reason, the resin discharge portion 12 is very close to the package body, so the resin discharge portion 12 may be in contact with the wire of the light emitting device package 50. In this case, the wire of the light emitting device package 50 may be broken. Even in the case that defects are caused by wire breakage, it is difficult to identify a defective light emitting device package with the naked eye. In the present embodiment, however, a defective light emitting device package may be easily identified by sensing an electrical signal by applying an electric current to the resin dispensing apparatus when the resin discharge portion 12 is in contact with the wire of the light emitting device package 50, and thus reliability in the manufacturing process of the light emitting device package may be enhanced.

At the time of the dispensing of the resin, the light emitting device package 50 may be disposed on the supporting part 20. A plurality of light emitting device packages 50 may be disposed on the supporting part 20 and the resin dispensing part 10 or the light emitting device packages 50 may be moved, such that the resin may be dispensed to fill the plurality of light emitting device packages 50. Here, the light emitting device package 50 is electrically connected to the supporting part 20, and when the resin discharge portion 12 is in contact with the light emitting device package 50, a voltage applied from the voltage applying part 40 is transferred from the resin dispensing part 10 to the sensing part 30 through the light emitting device package 50 and the supporting part 20 supporting the light emitting device package 50. Although not specifically shown, a circuit pattern may be formed on the supporting part 20 so as to transfer an electrical signal from the light emitting device package 50, or a plurality of via holes penetrating the supporting part 20 may be provided for electrical connections.

The voltage applying part 40 may supply power to the supporting part 20 and the resin dispensing part 10. Although not specifically shown, a circuit pattern or an electrical wiring pattern may be formed to apply a voltage to the supporting part 20 and the resin dispensing part 10. In FIG. 1, the resin dispensing part 10, the sensing part 30, the voltage applying part 40 and the supporting part 20 are connected in a sequential manner. However, the order of the sensing part 30 and the voltage applying part 40 or the like is not particularly limited within the scope of the object of the present invention being achieved. In addition, the voltage applying part 40 may be formed as a transformer connected to an external power source (for example, a commercial AC power source) and converting the inputted voltage into a voltage suitable for the driving of the resin dispensing apparatus. Alternatively, the voltage applying part 40 may be a power supply device supplying a driving voltage by itself.

The sensing part 30 senses whether the resin dispensing part 10 is in contact with the light emitting device package 50 or not. In a case in which the resin dispensing part 10 dispenses the resin to the light emitting device package 50 with a predetermined distance therebetween, the resin dispensing apparatus 100 according to the present embodiment is in an open state such that no current flows therethrough. In a case in which the resin dispensing part 10 is in contact with the light emitting device package 50, the resin dispensing apparatus 100 is in a closed state such that current flows therethrough. Accordingly, the sensing part 30 senses the current flow of the resin dispensing apparatus 100, such that it is able to determine whether or not the light emitting device package 50 is in contact with the resin dispensing part 10.

Figure 2:
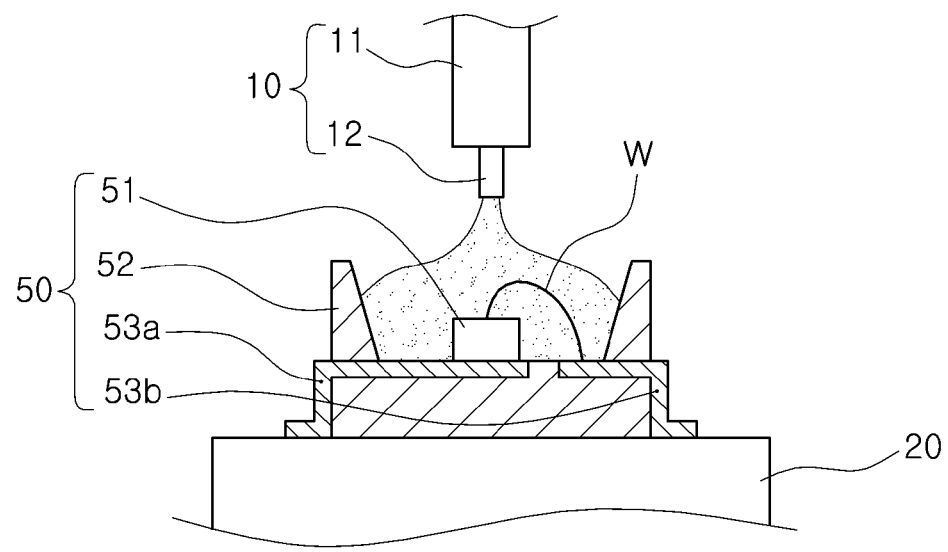
FIG. 2 is a schematic view illustrating the dispensing of a resin according to an exemplary embodiment of the present invention.

FIG. 2 is a schematic view illustrating the dispensing of a resin according to an exemplary embodiment of the present invention. With reference to FIG. 2, as shown in FIG. 1, the resin dispensing part 10 may include the resin storage portion 11 and the resin discharge portion 12 combined with the lower portion of the resin storage portion 11 and discharging the resin to the interior portion of the light emitting device package 50. In the resin dispensing apparatus 100 for a light emitting device package according to the present embodiment, the light emitting device package 50 may include a package body 52, at least a pair of lead frames 53a and 53b installed on the package body 52, and a light emitting device 51 electrically connected to the lead frames 53a and 53b and mounted in the package body 52. The pair of lead frames 53a and 53b may be electrically connected to the supporting part 20 of the resin dispensing apparatus.

The pair of lead frames 53a and 53b may be electrically connected to the light emitting device 51 using a conducting wire W, and may be used as terminals for applying external electrical signals to the light emitting device 51. To enable this, the pair of lead frames 53a and 53b may be formed of a metal having superior electrical conductivity. As shown in FIG. 2, one of the pair of lead frames 53a and 53b may be used as amounting area of the light emitting device 51. In the present embodiment, one electrode (not shown) disposed on the top of the light emitting device 51 is connected to the lead frame 53b using the conducting wire W and the other electrode (not shown) is directly connected to the lead frame 53a; however, the connection method may be modified in various manners. For example, a pair of electrodes may be formed on the top of the light emitting device 51 and be connected to the pair of lead frames 53a and 53b using the conducting wire W, respectively.

In this case, the pair of lead frames 53a and 53b may serve as a medium for making electrical connections between the light emitting device 51 and the supporting part 20. As described above, the circuit pattern or via holes (not shown) may be provided on the supporting part 20 for electrical connections with the pair of lead frames 53a and 53b. Also, the light emitting device 51 may be connected to the pair of lead frames 53a and 53b in a wire-bonding method. Since the wire W may be formed as a thin conducting wire and protrude upwardly as shown in FIG. 2, it may be easily damaged by a contact with the resin discharge portion 12. In a case in which the resin discharge portion 12 is in contact with the light emitting device 51 at the time of the dispensing of the resin, more specifically, in contact with the conducting wire W electrically connected to the light emitting device 51, the sensing part 30 may sense an electrical signal and identify a defective light emitting device package.

Figure 3:
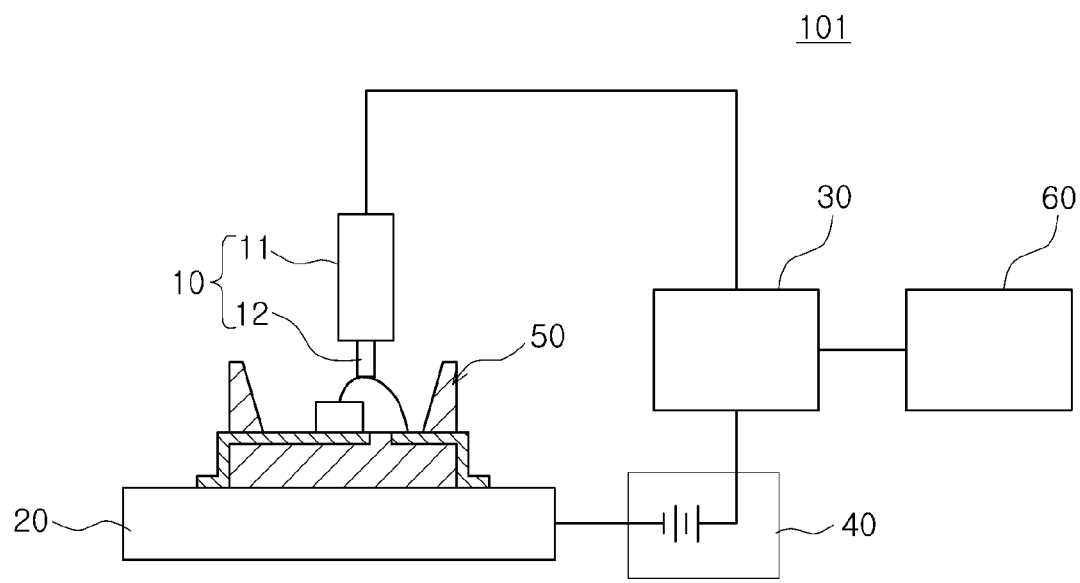
FIG. 3 is a schematic view illustrating a resin dispensing apparatus for a light emitting device package according to another exemplary embodiment of the present invention.

FIG. 3 is a schematic view illustrating a resin dispensing apparatus for a light emitting device package according to another exemplary embodiment of the present invention. With reference to FIG. 3, a resin dispensing apparatus 101 for a light emitting device package according to an exemplary embodiment of the invention includes the resin dispensing part 10 including the resin storage portion 11 filled with a liquid resin and the resin discharge portion 12 combined with the lower portion of the resin storage portion 11 and discharging the resin therefrom; the supporting part 20 having the light emitting device package 50 disposed on an upper surface thereof at the time of the dispensing of the resin and electrically connected to the light emitting device package 50; the voltage applying part 40 having both terminals respectively connected to the resin dispensing part 10 and the supporting part 20 to apply a voltage thereto; the sensing part 30 electrically connected to the resin dispensing part 10 and the supporting part 20 and sensing a contact between the resin discharge portion 12 and the light emitting device package 50 with an electrical signal; and a notifying part 60 operating when the electrical signal sensed by the sensing part 30 is greater than a preset value.

Contrary to the embodiment of FIG. 1, the resin dispensing apparatus 101 shown in FIG. 3 further includes the notifying part 60 operating when the electrical signal sensed by the sensing part 30 is greater than a preset value, wherein the preset value is set as a voltage or current value indicating whether or not an electric current is being applied to the resin dispensing apparatus 101 according to the present embodiment, regardless of noise. The notifying part 60 may be an indicator converting the sensed electrical signal into a visual signal or an alarm converting the sensed electrical signal into an audible signal. That is, the notifying part 60 may be a visual indicator or an audible alarm indicating whether the light emitting device package 50 is in contact with the resin dispensing part 10.

Figure 4:
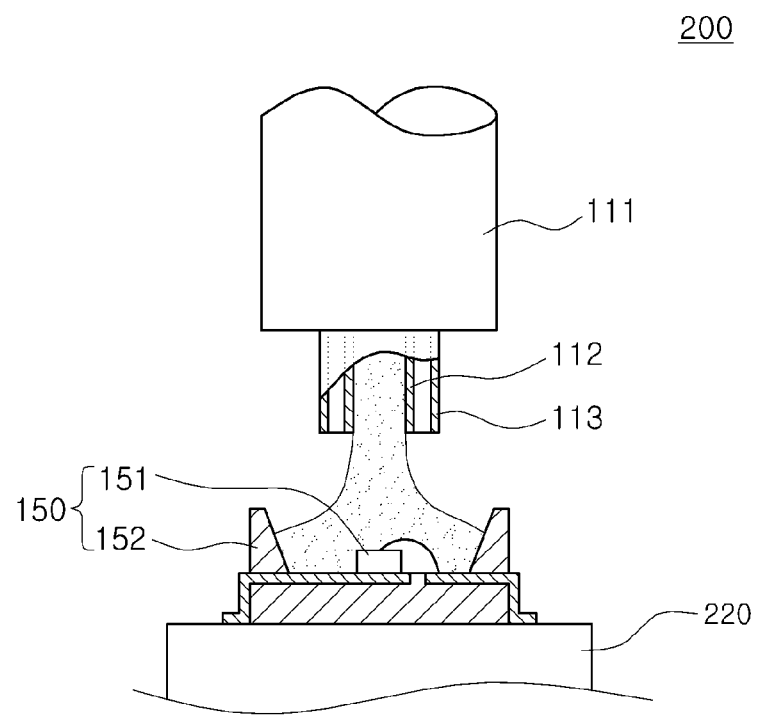
FIG. 4 is a partially cut-away schematic view illustrating a resin dispensing apparatus for a light emitting device package according to another exemplary embodiment of the present invention.
Figure 5:
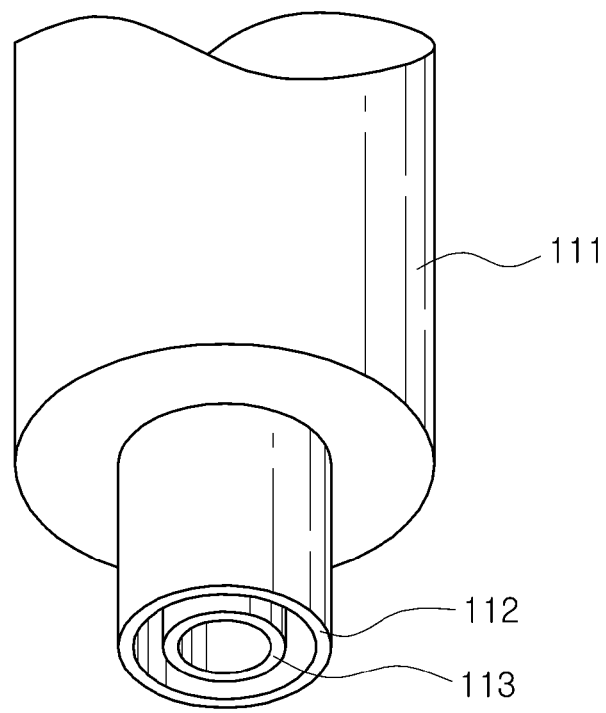
FIG. 5 is an enlarged view illustrating part of the resin dispensing apparatus of FIG. 4.

FIG. 4 is a partially cut-away schematic view illustrating a resin dispensing apparatus for a light emitting device package according to another exemplary embodiment of the present invention. FIG. 5 is an enlarged view illustrating part of the resin dispensing apparatus of FIG. 4. With reference to FIGS. 4 and 5, a resin dispensing apparatus 200 according to this exemplary embodiment includes a resin storage portion 111 storing a liquid resin therein, a resin discharge portion 112 combined with a lower portion of the resin storage portion 111 and discharging the resin therefrom, and a contact portion 113 disposed outwardly of the resin discharge portion 112 and having an end thereof corresponding to an end of the resin discharge portion 112, and formed to be in contact with at least a portion of a package body when the resin is dispensed to the package body. In this embodiment, the contact portion 113 formed outwardly of the resin discharge portion 112 and having an end thereof on the same plane as an end of the resin discharge portion 112.

The resin storage portion 111 has a space therein such that the space is filled with the liquid resin, and the liquid resin is discharged through the resin discharge portion 112 combined with the lower portion of the resin storage portion 111 to thereby fill an interior portion of a light emitting device package 150. The liquid resin may allow light emitted from a light emitting device 151 to be transmitted therethrough, and may allow a phosphor, a reflective material or the like that can be included within the liquid resin to be stably dispersed therein. Without being limited, any one of acrylic resin such as polymethyl methacrylate (PMMA) resin, polystyrene resin, polyurethane resin, benzoguanamine resin, epoxy resin and silicone resin may be used therefor. The liquid resin is applied to seal the light emitting device 151 mounted in a package body 152 and a conducting wire, thereby protecting the light emitting device 151 and the conducting wire and serving as a lens which determines light distribution according to the shape thereof.

The resin discharge portion 112 may have a diameter ranging from 400 μm to 500 μm, without being limited thereto. In general, the light emitting device package 150 has a length ranging from 500 μm to 700 μm. In a case in which the resin discharge portion 112 is injected into the interior portion of the light emitting device package 150, it may scratch the light emitting device package or damage the wire therein, resulting in a defective light emitting device package. Here, it is difficult to identify the defectiveness of the light emitting device package with the naked eye, and thus reliability in the manufacturing process of the light emitting device package may be degraded. According to the present embodiment, the contact portion 113 is formed outwardly of the resin discharge portion 112 and has the same height as the resin discharge portion 112. In a case in which the resin discharge portion 112 is injected into the light emitting device package 150, the contact portion 113 may leave a scratch on the package body of the light emitting device package, whereby a defective light emitting device package can be easily identified.

In the present embodiment, the contact portion 113 has a cylindrical shape having a diameter larger than that of the resin discharge portion 112, and is formed along an outer circumferential surface of the resin discharge portion 112. However, the contact portion 113 may have a shape different to that of the resin discharge portion 112, for example, a prism shape. Alternatively, the contact portion 113 may be formed on a portion of the resin discharge portion 112 adjacent to the end thereof. Meanwhile, the contact portion 113 may have a diameter larger than the width of the package body. For example, the contact portion 113 may have a diameter ranging from 600 μm to 1000 μm.

Figure 6:
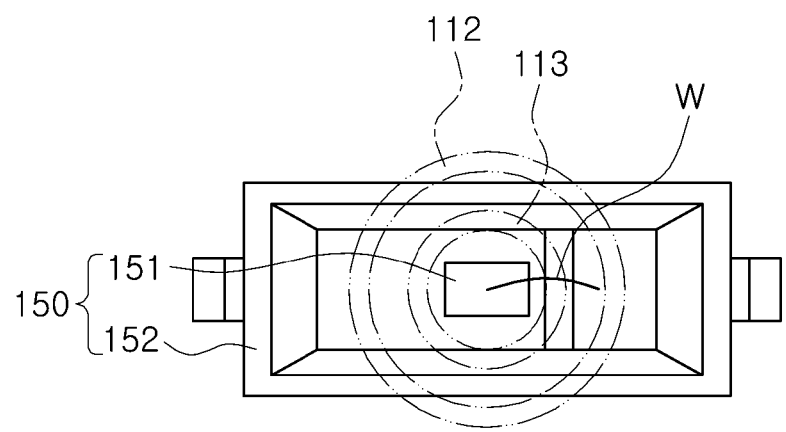
FIG. 6 is a schematic plan view illustrating the operating of a resin dispensing apparatus applied to the manufacturing process of a light emitting device package according to an exemplary embodiment of the present invention.

FIG. 6 is a schematic plan view illustrating the operating of a resin dispensing apparatus applied to the manufacturing process of a light emitting device package according to an exemplary embodiment of the present invention. With reference to FIG. 6, a resin dispensing apparatus for a light emitting device package according to an exemplary embodiment of the present invention may include the resin storage portion (not shown) storing a resin therein, the resin discharge portion 112 discharging the resin therefrom, and the contact portion 113 having the end thereof on the same plane as the end of the resin discharge portion 112. The contact portion 113 may have a diameter larger than the width of the rectangular package body 152 and smaller than the length of the rectangular package body 152. Accordingly, when the end of the resin discharge portion 112 disposed on the same plane with the end of the contact portion 113 is injected into the package body 152, a sidewall of package body 152 may be scratched by the contact portion 113. Therefore, it is easy to identify a defective light emitting device package with defects on a surface of the light emitting device 151 or the wire W.

Figure 7:
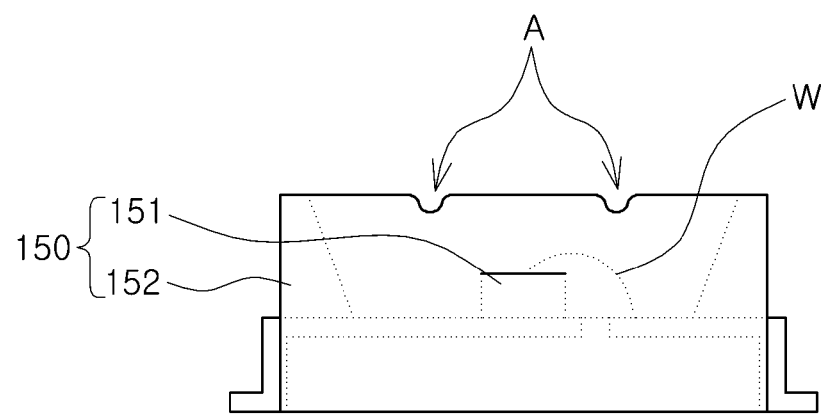
FIG. 7 is a schematic front view illustrating a light emitting device package manufactured by using a resin dispensing apparatus according to an exemplary embodiment of the present invention.

FIG. 7 is a schematic front view of a light emitting device package manufactured by using a resin dispensing apparatus according to an exemplary embodiment of the present invention. With reference to FIG. 7, the light emitting device package 150 includes the package body 152 and the light emitting device 151 mounted on the interior portion of the package body 152. In the case in which the resin discharge portion 112 of the resin dispensing apparatus 200 is injected into the interior portion of the light emitting device package 150, indentations A may be formed on an upper surface of the package body 152 by the contact portion 113 formed outwardly of the resin discharge portion 112 and having the end thereof on the same plane as the end of the resin discharge portion 112. Accordingly, it is easy to identify a defective light emitting device package with defects on the surface of the light emitting device 151 or the wire W, so that reliability in the manufacturing process of the light emitting device package may be enhanced.

As set forth above, according to exemplary embodiments of the invention, it is easy to identify a defective light emitting device package with defects on a light emitting device and a wire, and thus reliability in the manufacturing process of the light emitting device package can be enhanced.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of manufacturing a light emitting device package, the method comprising:
    disposing a light emitting device on a supporting part electrically connected to the light emitting device; and dispensing a resin to the light emitting device using a resin dispensing part electrically connected to the supporting part and discharging the resin therefrom, wherein the dispensing of the resin includes sensing whether or not the resin dispensing part is in contact with a light emitting device package with an electrical signal.

2. The method of claim 1, wherein the resin dispensing part includes a resin storage portion filled with the resin and a resin discharge portion combined with the resin storage portion and discharging the resin therefrom, and the electrical signal is sensed through a contact between the resin discharge portion and the light emitting device.

3. The method of claim 1, wherein the electrical signal is sensed through a contact between a wire connected to the light emitting device and the resin dispensing part.

4. A method of manufacturing a light emitting device package, the method comprising:

disposing a light emitting device; and dispensing a resin to the light emitting device using a resin dispensing apparatus, wherein the dispensing of the resin includes leaving a scratch on a light emitting device package when the resin dispensing apparatus is in contact with the light emitting device package.

5. The method of claim 4, wherein the resin dispensing apparatus includes a resin discharge portion discharging the resin therefrom, and a contact portion disposed outwardly of the resin discharge portion and having an end thereof corresponding to an end of the resin discharge portion, and the light emitting device package is scratched by a contact between the contact portion and the light emitting device package.

6. The method of claim 5, wherein the light emitting device package includes a package body filled with the resin and having a rectangular shape, and the contact portion has a diameter larger than a width of the package body and smaller than a length of the package body such that the contact portion leaves the scratch on the light emitting device package when being in contact with the package body.

7. The method of claim 5, wherein the contact portion and the resin discharge portion have the same height, and the contact portion leaves the scratch on the light emitting device package when the resin discharge portion is injected into the light emitting device package in the dispensing of the resin.

8. The method of claim 5, further comprising identifying whether the light emitting device package is defective or not depending on the scratch left on the light emitting device package.

* * * * *